US012805023B2

United States Patent
(12) United States Patent
Chen

(10) Patent No.: US 12,805,023 B2
(45) Date of Patent: Nov. 17, 2026

(54) ELECTROSTATIC DISCHARGE PROTECTION DEVICE

(71) Applicant: VIA TECHNOLOGIES, INC., New Taipei City (TW)

(72) Inventor: Ke-Yuan Chen, New Taipei City (TW)

(73) Assignee: VIA TECHNOLOGIES, INC., New Taipei City (TW)

(*) Notice: Subject to any disclaimer, the term of this patent is extended or adjusted under 35 U.S.C. 154(b) by 487 days.

(21) Appl. No.: 18/518,806

(22) Filed: Nov. 24, 2023

(65) Prior Publication Data

US 2025/0098330 A1 Mar. 20, 2025

(30) Foreign Application Priority Data

Sep. 18, 2023 (TW) ................................ 112135485

(51) Int. Cl.
*H10D 89/60* (2025.01)
*H10D 84/00* (2025.01)

(52) U.S. Cl.
CPC ......... *H10D 89/713* (2025.01); *H10D 84/135* (2025.01); *H10D 89/611* (2025.01)

(58) Field of Classification Search
CPC .. H10D 89/713; H10D 84/135; H10D 89/611; H10D 89/60; H10D 10/60
See application file for complete search history.

(56) References Cited

U.S. PATENT DOCUMENTS

2021/0082906 A1* 3/2021 Peng .................... H10D 89/611
2023/0040542 A1* 2/2023 Xu ....................... H10D 89/611

* cited by examiner

*Primary Examiner* — Julia Slutsker
(74) *Attorney, Agent, or Firm* — McClure, Qualey & Rodack, LLP

(57) ABSTRACT

An electrostatic discharge (ESD) protection device is provided. The ESD protection device includes a first ESD protection unit in a P-type semiconductor substrate to protect a first circuit. The first ESD protection unit includes first and second N-type and P-type well regions. The first N-type and P-type doped regions are in the first N-type well region. The second N-type and P-type doped regions are in the first P-type and second N-type well regions. The third N-type and P-type doped regions are in the second P-type well region. The first P-type and the third N-type doped regions are electrically connected to a common bus electrically connected to power supply and ground terminals of the first circuit. The first N-type and the second P-type doped regions are electrically connected to the power supply terminal. The second N-type and the third P-type doped regions are electrically connected to the ground terminal.

13 Claims, 11 Drawing Sheets

ELECTROSTATIC DISCHARGE PROTECTION DEVICE

CROSS REFERENCE TO RELATED APPLICATIONS

This Application claims priority of Taiwan Patent Application No. 112135485, filed on Sep. 18, 2023, the entirety of which is incorporated by reference herein.

BACKGROUND OF THE INVENTION

Field of the Invention

The present disclosure relates to an electrostatic discharge protection device, and, in particular, to the structure and layout of the electrostatic discharge protection device.

Description of the Related Art

Integrated circuits (ICs) include semiconductor devices that are susceptible to damage from electrical overstress conditions (EOS) which includes electrostatic discharge (ESD), transient conditions, latch-up, and incorrect polarity connections. These electrical overstress conditions are characterized by over-voltage and over-current stress events. Electrostatic charges (ESC) accumulate in IC packages, manufacturing machinery, or operators, and they can damage semiconductor devices and circuitry if the IC is stressed by the charge. This phenomenon is called electrostatic discharge. Therefore, how to protect semiconductor devices from ESD and other electrical overvoltage conditions is a problem that needs to be solved. In addition, for high-speed and high-end chips, a conventional ESD protection circuit using diodes or transistors cannot solve the ESD problem.

BRIEF SUMMARY OF THE INVENTION

An embodiment of the disclosure provides an electrostatic discharge protection device. The electrostatic discharge protection device includes a P-type semiconductor substrate and a first electrostatic discharge protection unit located in the P-type semiconductor substrate and used to protect a first circuit. The first electrostatic discharge protection unit includes a first N-type well region, a first N-type doped region, a first P-type doped region, a first P-type well region, a second N-type doped region, a second N-type well region, a second P-type doped region, a second P-type well region, a third N-type doped region and a third P-type doped region. The first N-type doped region is located in the first N-type well region. The first P-type doped region is located in the first N-type well region. The first P-type doped region and the first N-type doped region are arranged side-by-side and spaced apart from each other. The first P-type well region is adjacent to the first N-type well region. The second N-type doped region is located in the first P-type well region. The second N-type well region is arranged side-by-side with the first N-type well region. The second P-type doped region is located in the second N-type well region. The second P-type well region is adjacent to the second N-type well region. The third N-type doped region is located in the second P-type well region. The third P-type doped region is located in the second P-type well region. The third P-type doped region and the third N-type doped region are arranged side-by-side and spaced apart from each other. The first P-type doped region and the third N-type doped region of the first electrostatic discharge protection unit are electrically connected to a common bus. The first N-type doped region and the second P-type doped region of the first electrostatic discharge protection unit are electrically connected to a power supply terminal of the first circuit. The second N-type doped region and the third P-type doped region of the first electrostatic discharge protection unit are electrically connected to a ground terminal of the first circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
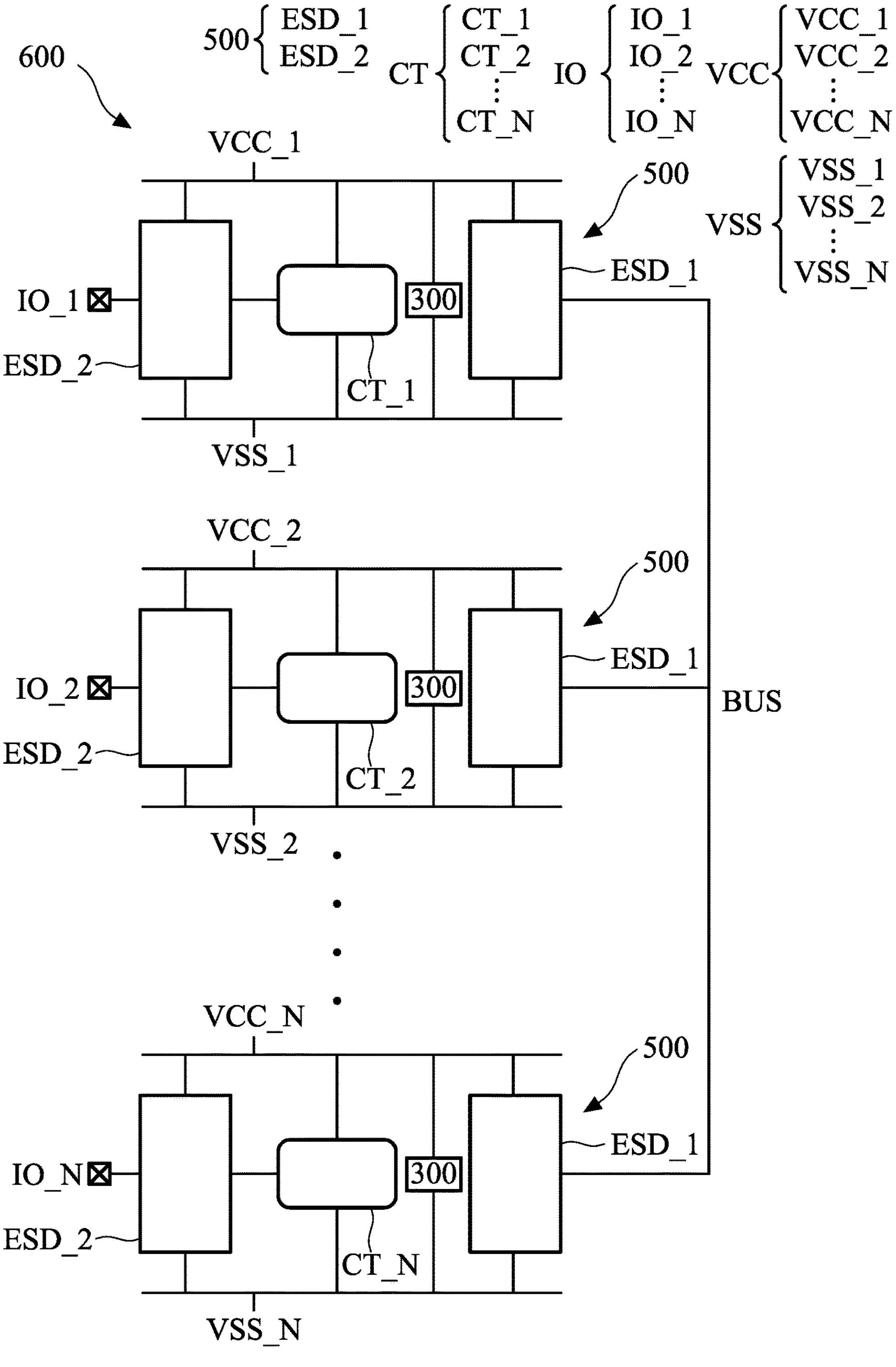
FIG. 1 is a schematic connection diagram of an electrostatic discharge protection device in accordance with some embodiments of the disclosure.
Figure 2:
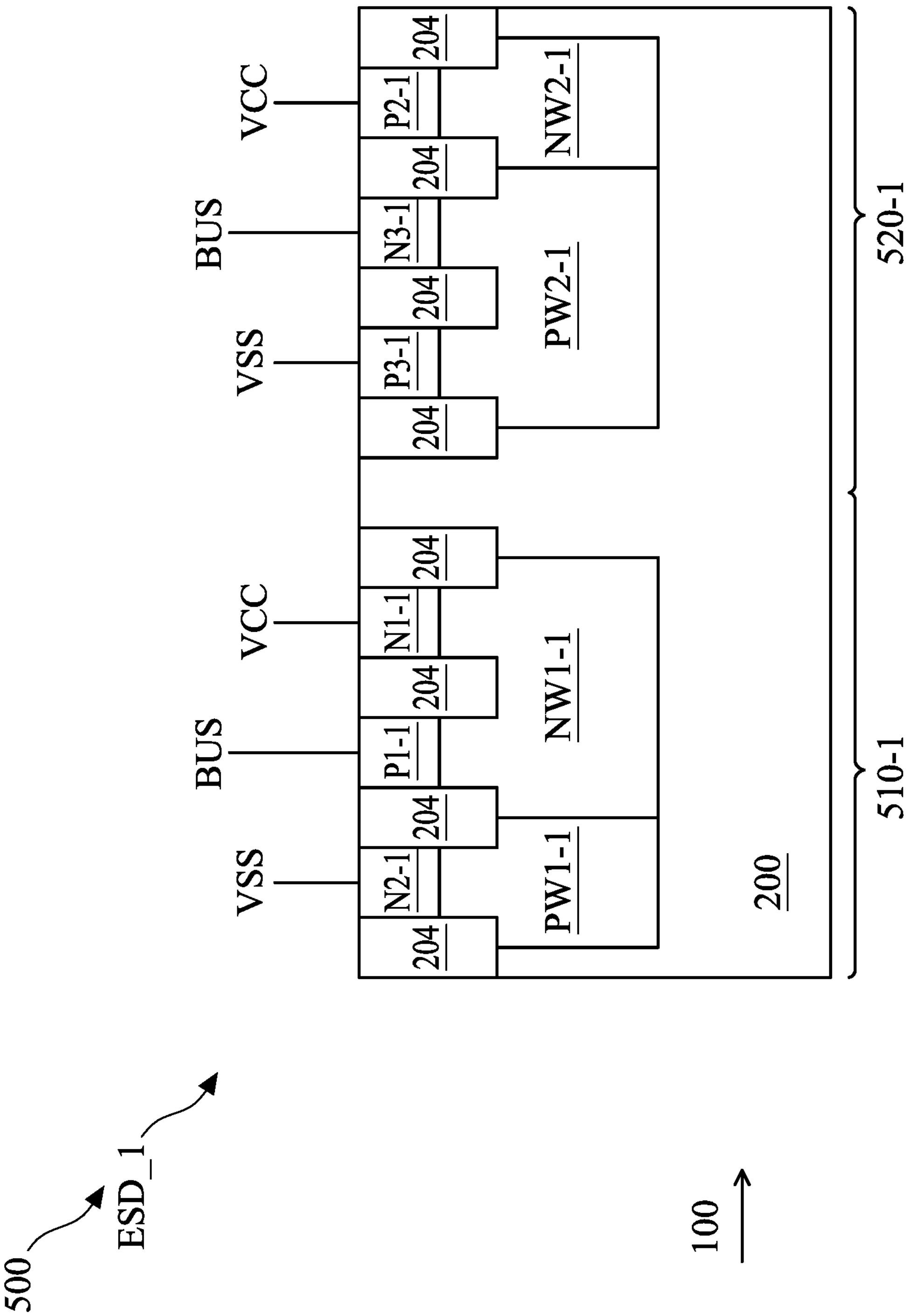
FIG. 2 is a schematic cross-sectional view of an electrostatic discharge protection unit of an electrostatic discharge protection device in accordance with some embodiments of the disclosure.
Figure 3:
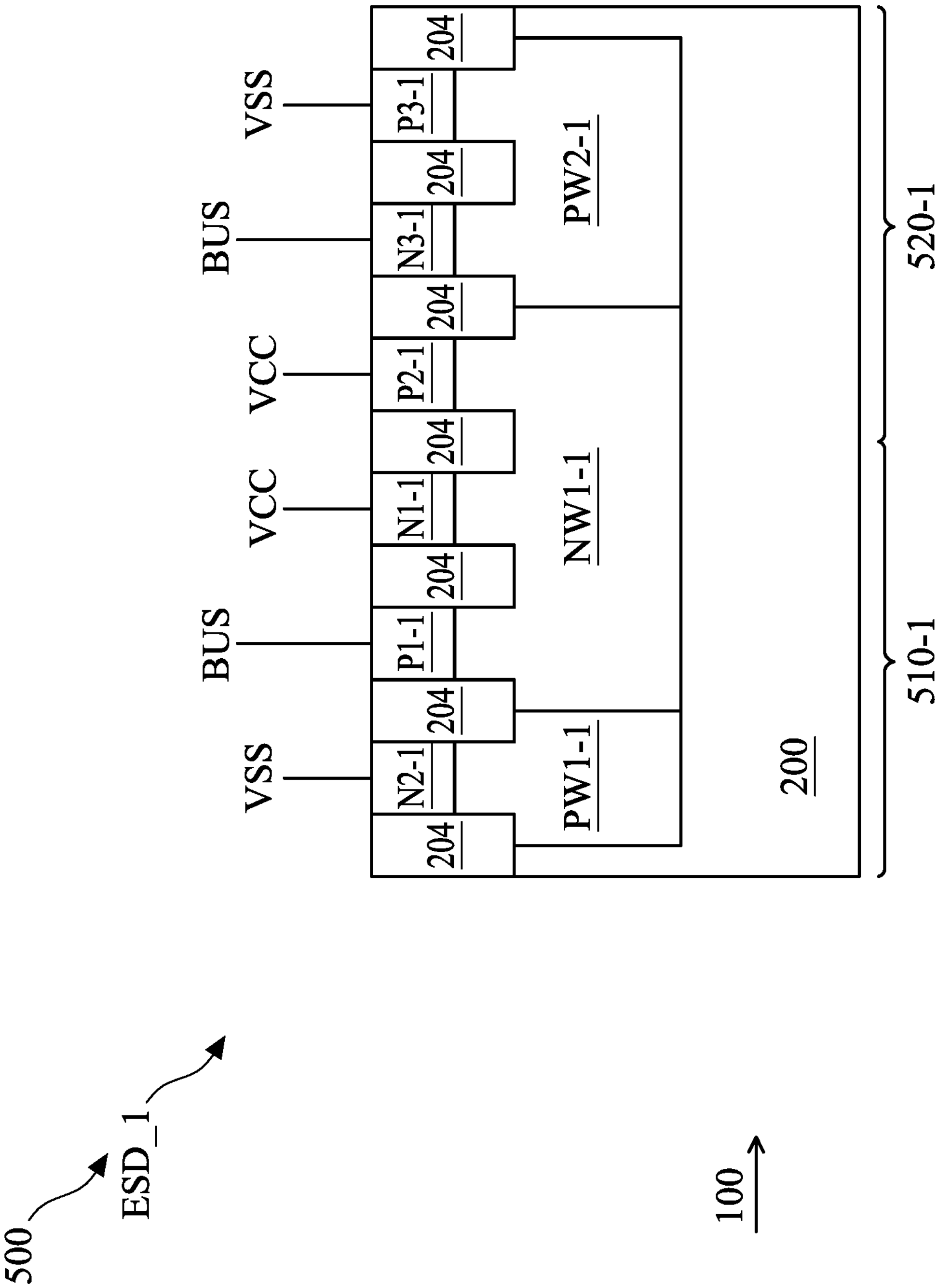
FIG. 3 is a schematic cross-sectional view of an electrostatic discharge protection unit of an electrostatic discharge protection device in accordance with some embodiments of the disclosure.
Figure 4:
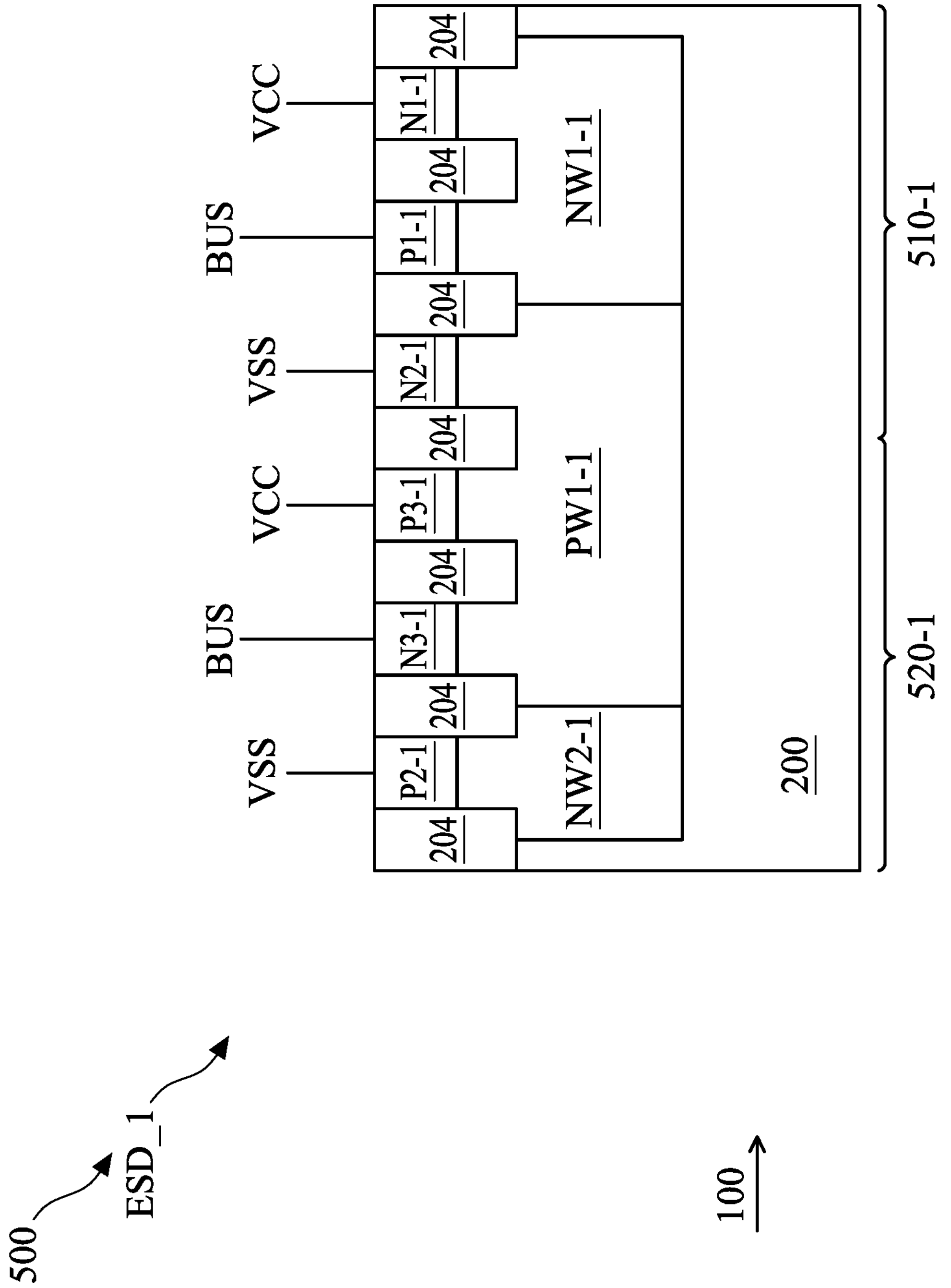
FIG. 4 is a schematic cross-sectional view of an electrostatic discharge protection unit of an electrostatic discharge protection device in accordance with some embodiments of the disclosure.

FIG. 1 is a schematic connection diagram of electrostatic discharge (ESD) protection devices 500 disposed in a system 600 in accordance with some embodiments of the disclosure. FIGS. 2, 3, and 4 are schematic cross-sectional views of an electrostatic discharge protection unit ESD-1 of the ESD protection device 500 in accordance with some embodiments of the disclosure. The system 600 includes circuits under protection CT (including circuits under protection CT_1, CT_2 . . . CT_N) and the corresponding electrostatic discharge protection devices 500. Each of the circuits under protection CT has a corresponding input/output terminal IO (including input/output terminals IO_1, IO_2 . . . IO_N), a corresponding power supply terminal VCC (including power supply terminals VCC_1, VCC_2 . . . VCC_N) and a corresponding ground terminal VSS (including ground terminals VSS_1, VSS_2 . . . VSS_N). Moreover, the power supply terminals VCC_1, VCC_2 . . . VCC_N and the ground terminals VSS_1, VSS_2 . . . VSS_N of each of the circuits under protection CT_1, CT_2 . . . CT_N are connected to the common bus BUS. It is noted that the electrical connections of the conventional system are that the power supply terminals VCC_1, VCC_2 . . . VCC_N of the circuits under protection CT_1, CT_2 . . . CT_N are separately connected to the power bus, the ground terminals VSS_1, VSS_2 . . . VSS_N are separately connected to the ground bus. Unlike the conventional system, the power supply terminals VCC_1, VCC_2 . . . VCC_N and the ground terminals VSS_1, VSS_2 . . . VSS_N of the circuits under protection CT_1, CT_2 . . . CT_N of the system 600 of the disclosure are all connected to the common bus BUS, so that the layout area of the system can be reduced. In addition, as shown in FIG. 1, each of the ESD protection devices 500 includes an ESD protection unit ESD-1 and an ESD protection unit ESD-2 for protecting the circuit under protection CT. As shown in FIG. 1, the ESD protection unit ESD-1 of each of the ESD protection devices 500 is electrically connected between the common bus BUS, the power supply terminal VCC_1, VCC_2 . . . VCC_N of the corresponding circuits under protection CT_1, CT_2 . . . CT_N and the ground terminals VSS_1, VSS_2 . . . VSS_N of the system 600 to prevent electrostatic discharge current from flowing through the circuits under protection CT_1, CT_2 . . . CT_N. Each of the ESD protection units ESD-2 of the ESD protection devices 500 is electrically connected between the input/output terminals IO_1, IO_2 . . . IO_N, the power supply terminals VCC_1, VCC_2 . . . VCC_N and the ground terminals VSS_1, VSS_2 . . . VSS_N of the corresponding circuits under protection CT_1, CT_2 . . . CT_N to prevent electrostatic discharge current from flowing through the circuit under protection CT_1, CT_2 . . . CT_N. In addition, the system 600 further includes power clamp circuits 300, which are disposed between the power supply terminals VCC and the ground terminals VSS of the respective circuits under protection CT. The power clamp circuits 300 are electrically connected to the power supply terminals VCC and the ground terminals VSS of the corresponding circuits under protection CT (the connections and the structure of the power clamp circuit 300 may be refer to FIG. 6A or FIG. 7A).

FIG. 2 is a schematic cross-sectional view of the ESD protection unit ESD-1 of the ESD protection device 500 in accordance with some embodiments of the disclosure. As shown in FIG. 2, the ESD protection device 500 includes a P-type semiconductor substrate 200 and the ESD protection unit ESD-1 located in the P-type semiconductor substrate 200. The ESD protection unit ESD-1 includes a first N-type well region NW1-1, a second N-type well region NW2-1, a first P-type well region PW1-1, and a second P-type well region PW2-1. Each of the first N-type well region NW1-1 and the second P-type well region PW2-1 includes at least a pair of heavily doped regions with opposite conductivity types. For example, the first N-type well region NW1 includes a first N-type doped region (an N-type heavily doped region) N1-1 and a first P-type doped region (a P-type heavily doped region) P1-1. The second P-type well region PW2-1 includes a third N-type doped region (an N-type heavily doped region) N3-1 and a third P-type doped region (P-type heavily doped region) P3-1. In addition, each of the first P-type well region PW1-1 and the second N-type well region NW2-1 includes at least one heavily doped region, and the well region has a conductivity type opposite to the heavily doped region located therein. For example, the first P-type well region PW1-1 includes a second N-type doped region (an N-type heavily doped region) N2-1, and the second N-type well region NW2-1 includes a second P-type doped region a (P-type heavily doped region) P2-1.

As shown in FIG. 2, the first N-type well region NW1-1 and the first P-type well region PW1-1 are arranged side-by-side and adjacent to each other along the direction 100 (i.e., the direction substantially parallel to the surface of the P-type semiconductor substrate 200 (also serves as a lateral direction)). The first N-type doped region N1-1 and the first P-type doped region P1-1 located in the first N-type well region NW1-1 are arranged side-by-side along the direction 100 and spaced apart from each other by an isolation feature 204, for example, a shallow trench isolation (STI). The second N-type doped region N2-1 located in the first P-type well region PW1-1 and the first P-type doped region P1-1 in the first N-type well region NW1-1 are side-by-side along the direction 100 and spaced apart from each other by the isolation feature 204, such as a shallow trench isolation (STI), Moreover, the first P-type doped region P1-1 is laterally (along the direction 100) located between the first N-type doped region N1-1 and the second N-type doped region N2-1 located in the first P-type well region PW1-1. In this embodiment, the first N-type doped region N1-1 is electrically connected to the power supply terminal VCC of the corresponding circuit under protection CT. The first P-type doped region P1-1 is electrically connected to the common bus BUS. In addition, the second N-type doped region N2-1 is electrically connected to the ground terminal VSS of the corresponding circuit under protection CT.

As shown in FIG. 2, the second N-type well region NW2-1 and the second P-type well region PW2-1 are arranged side-by-side along the direction 100 and adjacent to each other. In some embodiments, the adjacent second N-type well region NW2-1 and the second P-type well region PW2-1 are separated from the adjacent first N-type well region NW1-1 and the first P-type well region PW1-1 by the isolation feature 204, for example, a shallow trench isolation (STI). The third N-type doped region N3-1 and the third P-type doped region P3-1 located in the second P-type well region PW2-1 are arranged side-by-side along the direction 100 and spaced apart from each other by the isolation feature 204, for example, a shallow trench isolation (STI). The second P-type doped region P2-1 located in the second N-type well region NW2-1 and the third N-type doped region N3-1 located in the second P-type well region PW2-1 are arranged side-by-side along the direction 100 and spaced apart from each other by the isolation feature 204, for example, a shallow trench isolation (STI). Moreover, the third N-type doped region N3-1 is laterally (along the direction 100) located between the third P-type doped region P3-1 and the second P-type doped region P2-1 located in the second N-type well region NW2-1. In this embodiment, the second P-type doped region P2-1 is electrically connected to the power supply terminal VCC of the corresponding circuit under protection CT. The third N-type doped region N3-1 is electrically connected to the common bus BUS. In addition, the third P-type doped region P3-1 is electrically connected to the ground terminal VSS of the corresponding circuit under protection CT.

FIG. 3 is a schematic cross-sectional view of the ESD protection unit ESD-1 of the ESD protection device 500 in accordance with some embodiments of the disclosure. One of the differences between the ESD protection units ESD-1 shown in FIGS. 2 and 3 is that the first N-type well region NW1-1 of the ESD protection unit ESD-1 shown in FIG. 3 is formed by merging the first N-type well region NW1-1 and the second N-type well region NW2-1 of the ESD protection unit ESD-1 shown in FIG. 2. In other words, the second N-type well region of the ESD protection unit ESD-1 shown in FIG. 3 (the second N-type well region NW2-1 of FIG. 2 is not shown in FIG. 3) may be a portion of the first N-type well region NW1-1, so that the first N-type doped region N1-1, the first P-type doped region P1-1 and the second P-type doped region P2-1 are all located in the first N-type well region in the region NW1-1. In addition, the first N-type doped region N1-1 is laterally (along the direction 100) located between the first P-type doped region P1-1 and the second P-type doped region P2-1. Furthermore, the first N-type doped region N1-1 is spaced apart from the first P-type doped region P1-1 and the second P-type doped region P2-1 by the isolation features 204, for example, shallow trench isolations (STIs). Compared with FIG. 2, the ESD protection unit ESD-1 shown in FIG. 3 may save the area of the N-type well region.

FIG. 4 is a schematic cross-sectional view of the ESD protection unit ESD-1 of the ESD protection device 500 in accordance with some embodiments of the disclosure. One of the differences between the ESD protection units ESD-1 shown in FIGS. 2 and 4 is that the first P-type well region PW1-1 of the electrostatic discharge protection unit ESD-1 shown in FIG. 4 is formed by merging the first P-type well region PW1-1 and the second P-type well region PW2-1 of the ESD protection unit ESD-1 shown in FIG. 2. In other words, the second P-type well region of the electrostatic discharge protection unit ESD-1 shown in FIG. 4 (the second P-type well region PW2-1 of FIG. 2 is not shown in FIG. 4) may be a portion of the first P-well region PW1-1, so that the second N-type doped region N2-1, the third P-type doped region P3-1 and the third N-type doped region N3-1 are all located in the first P-type well in the region PW1-1. In addition, the third P-type doped region P3-1 is laterally (along the direction 100) located between the second N-type doped region N2-1 and the third N-type doped region N3-1. Furthermore, the third P-type doped region P3-1 is spaced apart from the second N-type doped region N2-1 and the third N-type doped region N3-1 by the isolation features 204, for example, shallow trench isolations (STIs). Compared with the ESD protection unit ESD-1 shown in FIG. 2, the ESD protection unit ESD-1 shown in FIG. 4 may save the area of the P-type well region. It is noted that the ESD protection units ESD-1 of the ESD protection devices 500 disposed in the system 600 may be selected from the same kind or any combinations of the ESD protection units ESD-1 shown in FIGS. 2 to 4. The number of the ESD protection devices 500 arranged in the system 600 depends on the demand.

Next, the regions 510-1 and 520-1 of the ESD protection unit ESD-1 of the ESD protection device 500 shown in FIG. 2 are used to describe the equivalent circuit diagrams and the discharge current paths triggered by each electrostatic discharge event occurring at the common bus BUS, the power supply terminal VCC or the ground terminal VSS. In some embodiments, the equivalent circuit diagrams and the current discharge paths between different terminals of the ESD protection unit ESD-1 of the ESD protection device 500 shown in FIGS. 3 and 4 triggered by the electrostatic discharge events are the same as those of the ESD protection unit ESD-1 of the ESD protection device 500 shown in FIG. 2, and the details are not repeated herein.

Figure 5:
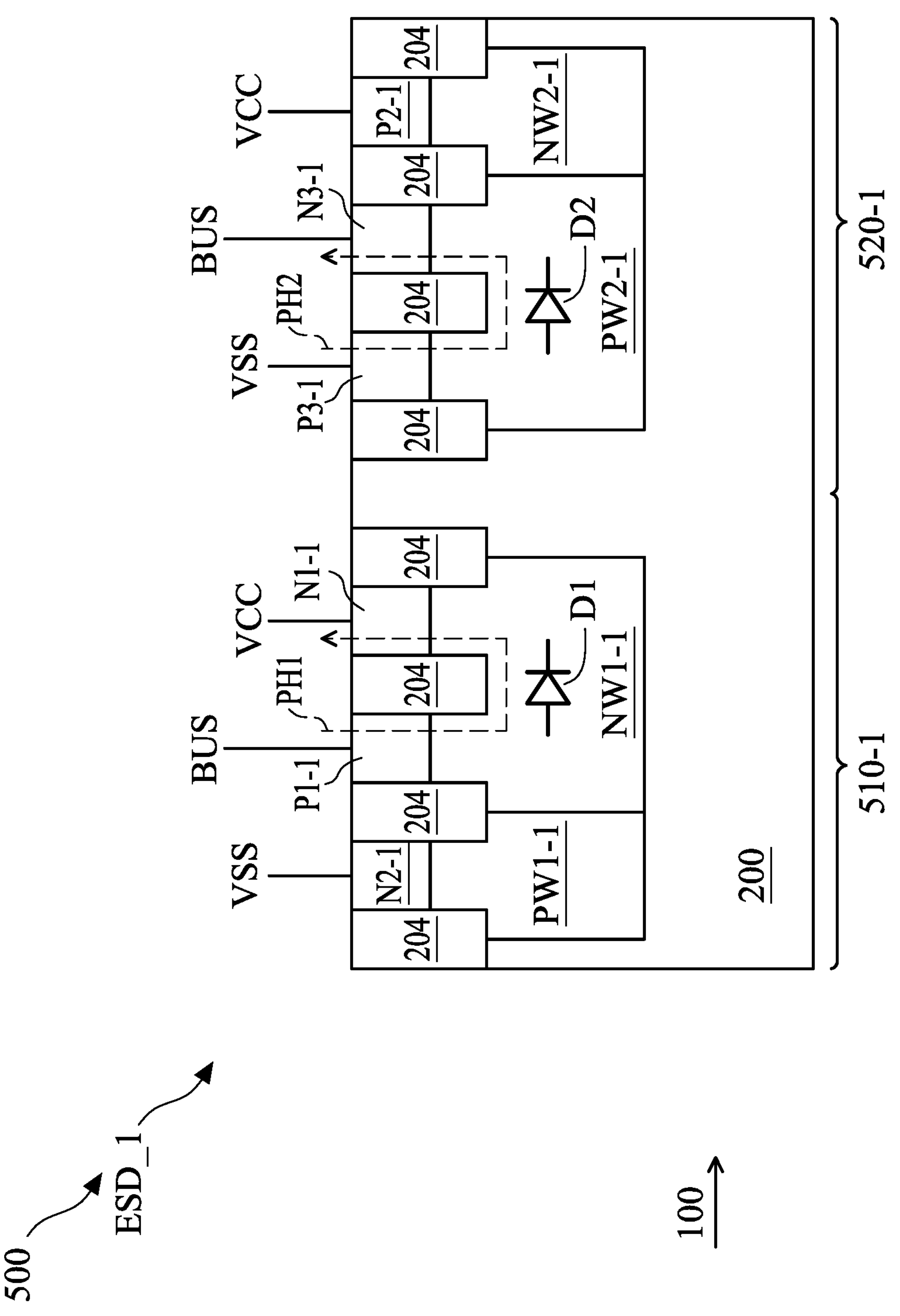
FIG. 5 shows an equivalent discharge circuit diagram of an electrostatic discharge protection device when an electrostatic discharge event occurs between a common bus (BUS) and a power supply terminal (VCC) of a circuit under protection or between the ground terminal (VSS) of the circuit under protection and the common bus (BUS), and also shows the parasitic elements of the equivalent discharge circuit at the corresponding positions of the electrostatic discharge protection device of FIG. 2.

FIG. 5 shows an equivalent discharge circuit diagram of the ESD protection device 500 when an electrostatic discharge event occurs between the common bus BUS and the power supply terminal VCC of the circuit under protection CT (FIG. 1) or between the ground terminal VSS of the circuit under protection CT (FIG. 1) and the common bus BUS. FIG. 5 also shows the parasitic elements of the equivalent discharge circuit at the corresponding positions of the ESD protection device 500 of FIG. 2. As shown in FIG. 5, the first P-type doped region P1-1, the first N-type well region NW1-1 and the first N-type doped region N1-1 form a first parasitic diode D1. When an electrostatic discharge event occurs between the common bus BUS and the power supply terminal VCC of the circuit under protection CT (FIG. 1), the first parasitic diode D1 is triggered to ON to form a current path PH1 from the common bus BUS to the supply terminal VCC of the circuit under protection CT to discharge the electrostatic charges away from the circuit under protection CT.

As shown in FIG. 5, the third P-type doped region P3-1, the second P-type well region PW2-1 and the third N-type doped region N3-1 form a second parasitic diode D2. When an electrostatic discharge event occurs between the ground terminal VSS of the circuit under protection CT (FIG. 1) and the common bus BUS, the second parasitic diode D2 is triggered to ON to form a current path PH2 from the ground terminal VSS of the circuit under protection CT to the common bus BUS to discharge the electrostatic charges away from the circuit under protection CT.

Figure 6B:
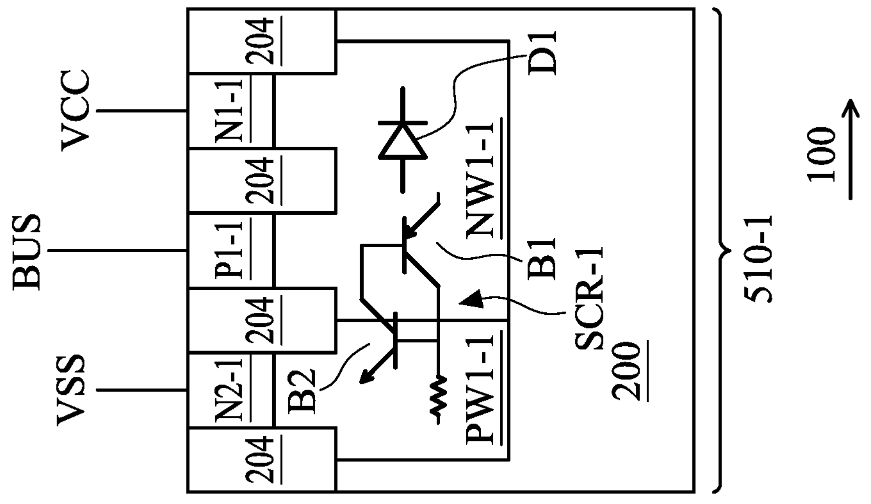
FIG. 6B shows the parasitic elements of the equivalent discharge circuit of FIG. 6A at the corresponding positions of the electrostatic discharge protection device of FIG. 2.
Figure 6A:
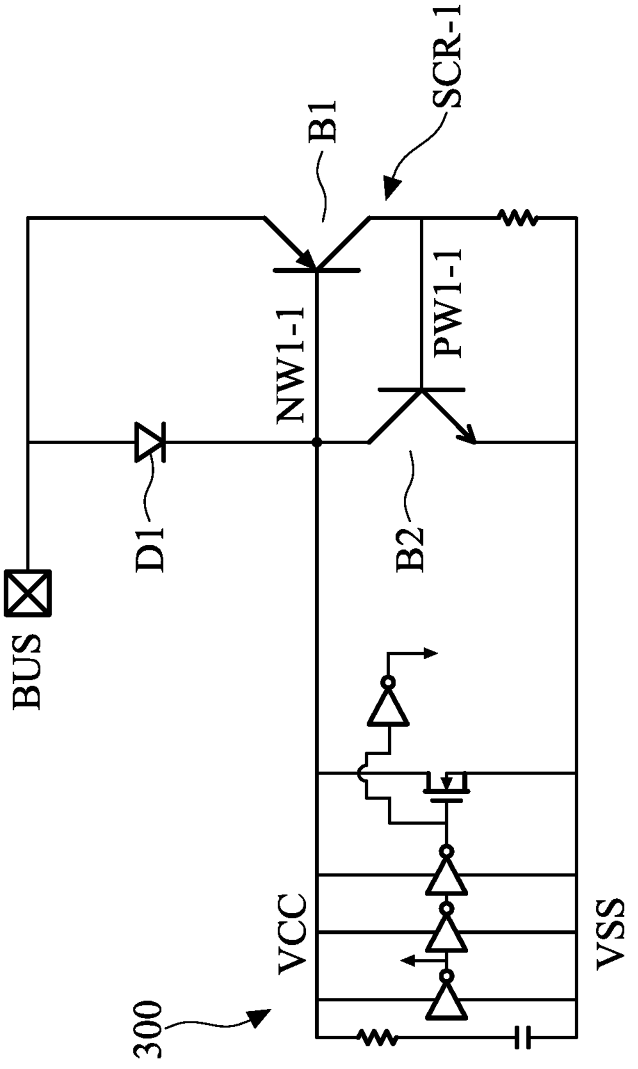
FIG. 6A shows an equivalent discharge circuit diagram of an electrostatic discharge protection device when an electrostatic discharge event occurs between the common bus (BUS) and the ground terminal (VSS) of the circuit under protection.

FIG. 6A shows an equivalent discharge circuit diagram of the ESD protection device 500 and the power clamp circuit 300 electrically connected thereto when an ESD event occurs between the common bus BUS and the ground terminal VSS of the circuit under protection CT. FIG. 6B is a partial enlarged view of the region 510-1 in FIG. 2, showing the parasitic elements of the equivalent discharge circuit of FIG. 6A at the corresponding positions of the ESD protection unit ESD-1 of the ESD protection device 500 of FIG. 2. As shown in FIGS. 6A and 6B, except for the first parasitic diode D1, the equivalent discharge circuit in a condition that the electrostatic discharge event occurs between the common bus BUS and the ground terminal VSS of the circuit under protection CT further includes a first parasitic bipolar junction transistor (BJT) B1 (for example, a parasitic PNP BJT) formed by the first P-type doped region P1-1, the first N-type well region NW1-1 and the first P-type well region PW1-1. Emitter, base and collector of the first parasitic bipolar junction transistor B1 are respectively formed by the first P-type doped region P1-1, the first N-type well region NW1-1 and the first P-type well region PW1-1. The equivalent circuit further includes a second parasitic bipolar junction transistor B2 (for example, a parasitic NPN BJT) formed by the second N-type doped region N2-1, the first P-type well region PW1-1 and the first N-type well region NW1-1. Emitter, base and collector of the second parasitic bipolar junction transistor B2 are respectively formed by the second N-type doped region N2-1, the first P-type well region PW1-1 and the first N-type well region NW1-1. Moreover, the base (the first N-type deep well region NW1-1) of the first parasitic bipolar junction transistor B1 is electrically connected to the collector (the first N-type well region NW1-1) of the second parasitic bipolar junction transistor B2, the base (the first P-type well region PW1-1) of the second parasitic bipolar junction transistor B2 is electrically connected to the collector (the first P-type well region PW1-1) of the first parasitic bipolar junction transistor B1 to form a first parasitic semiconductor-controlled rectifier SCR-1. In addition, the emitter (the first P-type doped region P1-1) of the first parasitic bipolar junction transistor B1 is electrically connected to the common bus BUS and the anode of the first parasitic diode D1. The base (the first N-well region NW1-1) of the first bipolar junction transistor B1 is electrically connected to the power supply terminal VCC of the circuit under protection CT and the cathode of the first parasitic diode D1. The emitter (the second N-type doped region N2-1) of the second parasitic bipolar junction transistor B2 is electrically connected to the ground terminal VSS of the circuit under protection CT.

FIG. 6A also shows the equivalent circuit of the power supply clamp circuit 300. The power clamp circuit 300 is formed by a resistor-capacitor detector (RC detector), which includes one or more resistors, one or more capacitors, one or more inverters and one or more N-type metal-oxide-semiconductor (MOS) transistors.

As shown in FIGS. 6A and 6B, when an electrostatic discharge (ESD) event occurs between the common bus BUS and the ground terminal VSS of the circuit under protection CT (FIG. 1), the first parasitic diode D1 and the emitter (the first P-type doped region P1-1)-base (the first N-type well region NW1-1) junction of the first parasitic bipolar junction transistor B1 are forward biased and simultaneously triggered to ON to form a current path flowing from the common bus BUS, through the emitter (the first P-type doped region P1-1)-base (the first N-type well region NW1-1) junction of the first parasitic bipolar junction transistor B1 and to the power supply terminal VCC of the circuit under protection CT, so that the first parasitic bipolar junction transistor B1 is triggered to ON. At the same time, there will also be a small amount of leakage current flowing from the power supply terminal VCC of the circuit under protection CT, through the power clamp circuit 300 and to the ground terminal VSS of the protection circuit CT, so that the voltage level of the ground terminal VSS of the protection circuit CT is lower than the voltage level of the power supply terminal VCC of the protection circuit CT. The current path may apply a forward bias to the base (the first P-type well region PW1-1)-emitter (the second N-type doped region N2-1) junction of the second parasitic bipolar junction transistor B2 to trigger the second parasitic bipolar junction transistor B2 to ON. Since the first parasitic bipolar junction transistor B1 and the second parasitic bipolar junction transistor B2 are triggered to ON simultaneously, the first parasitic semiconductor-controlled rectifier SCR-1 is accordingly triggered to ON and forms a current path. The current path allows a trigger current (ON current) to flow through, which triggers the first parasitic bipolar junction transistor B1 (such as a parasitic PNP BJT) and the second parasitic bipolar junction transistor B2 (such as a parasitic NPN BJT) to turn on, and the first parasitic semiconductor-controlled rectifier SCR-1 formed by the first parasitic bipolar junction transistor B1 and the second parasitic bipolar junction transistor B2 is accordingly triggered to ON. The first parasitic semiconductor-controlled rectifier SCR-1 with low holding voltage ($V_{Hold}$) and low resistance ($R_{on}$) may provide a current path from the common bus BUS to the ground terminal VSS of the circuit under protection CT to discharge the electrostatic charges away from the circuit under protection CT.

Figure 7B:
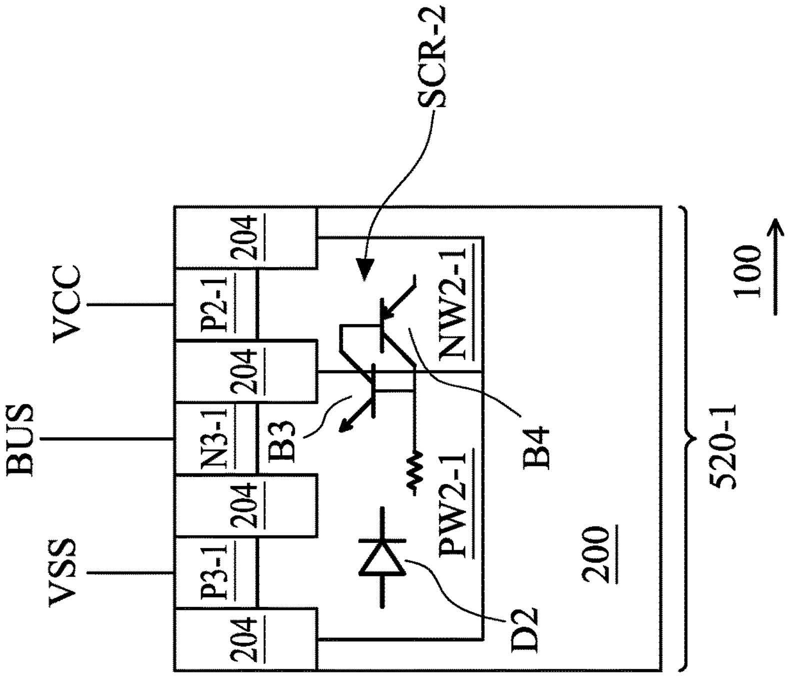
FIG. 7B illustrates the parasitic elements of the equivalent discharge circuit of FIG. 7A at the corresponding positions of the electrostatic discharge protection device of FIG. 2.
Figure 7A:
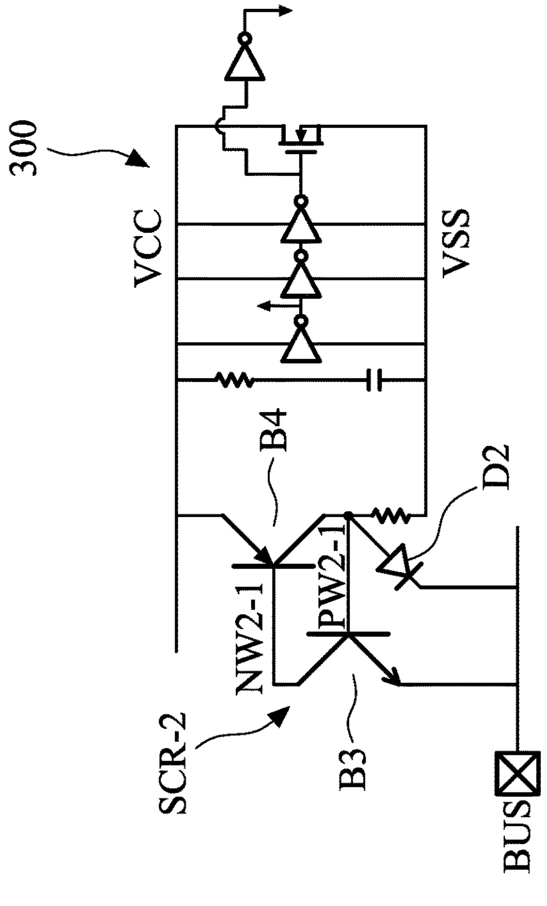
FIG. 7A illustrates an equivalent discharge circuit diagram of an electrostatic discharge protection device when an electrostatic discharge event occurs between the power supply terminal (VCC) of the circuit under protection and the common bus (BUS)

FIG. 7A shows an equivalent discharge circuit diagram (including the equivalent circuit of the power clamp circuit 300) of the ESD protection device 500 when an ESD event occurs between the power supply terminal VCC of the circuit under protection CT and the common bus BUS. FIG. 7B is a partial enlarged view of the region 520-1 in FIG. 2, showing the parasitic elements of the equivalent discharge circuit of FIG. 7A at the corresponding positions of the electrostatic discharge protection unit ESD-1 of the ESD protection device of FIG. 2. As shown in FIGS. 7A and 7B, except for the second parasitic diode D2, the equivalent circuit further includes a third parasitic bipolar junction transistor B3 (for example, a parasitic NPN BJT) formed by the third N-type doped region N3-1, a second P-type well region PW2-1 and a second N-type doped region NW2-1. Emitter, base and collector of the third parasitic bipolar junction transistor B3 are respectively formed by the third N-type doped region N3-1, the second P-type well region PW2-1 and the second N-type well region NW2-1. The equivalent circuit further includes a fourth parasitic bipolar junction transistor B4 (for example, a parasitic PNP BJT) formed by the second P-type doped region P2-1, the second well region NW2-1 and the second P-type well region PW2-1. Emitter, base and collector of the fourth parasitic bipolar junction transistor B4 are respectively formed by the second P-type doped region P2-1, the second N-type well region NW2-1 and the second P-type well region PW2-1. Furthermore, the base (the second P-type well region PW2-1) of the third parasitic bipolar junction transistor B3 is electrically connected to the collector (the second P-type well region PW2-1) of the fourth parasitic bipolar junction transistor B4, and the base (the second N-type well region NW2-1) of the fourth parasitic bipolar junction transistor B4 is electrically connected to the collector (the second The N-type well region NW2-1) of the third parasitic bipolar junction transistor B3 to form a second parasitic semiconductor-controlled rectifier SCR-2. In addition, the emitter (the third N-type doped region N3-1) of the third parasitic bipolar junction transistor B3 is electrically connected to the common bus BUS and the cathode of the second parasitic diode D2. The base (the second P-well region PW2-1) of the third parasitic bipolar junction transistor B3 is electrically connected to the ground terminal VSS of the circuit under protection CT and the anode of the second parasitic diode D2. The emitter (the second P-type doped region P2-1) of the fourth parasitic bipolar junction transistor B4 is electrically connected to the power supply terminal VCC of the circuit under protection CT.

As shown in FIGS. 7A and 7B, when an ESD event occurs between the power supply terminal VCC of the circuit under protection CT (FIG. 1) and the common bus BUS, the electrostatic discharge current will first flow through the power clamp circuit 300 outputs a low voltage level to the ground terminal VSS of the circuit under protection CT to form a current path. The low voltage level is lower than the voltage level of the power supply terminal VCC. The electrostatic discharge current then flows through the second parasitic diode D2 to the common bus BUS. The electrostatic discharge current flowing through the second parasitic diode D2 may apply a forward bias to the base (the second P-type well region PW2-1)-emitter (the third N-type doped region N3-1) junction of the third parasitic bipolar junction transistor B3, so that the third parasitic bipolar junction transistor B3 is triggered to ON, and the fourth parasitic bipolar junction transistor B4 is accordingly triggered to ON. Since the third parasitic bipolar junction transistor B3 and the fourth parasitic bipolar junction transistor B4 are triggered to ON simultaneously, the second parasitic semiconductor-controlled rectifier SCR-2 is accordingly triggered to ON and forms a current path flowing through the common bus BUS. The current path provides a trigger current (ON current), which triggers the third parasitic bipolar junction transistor B3 (such as a parasitic NPN BJT) and the fourth parasitic bipolar junction transistor B4 (such as a parasitic PNP BJT), thereby the second parasitic semiconductor-controlled rectifier SCR-2 formed by the third parasitic bipolar junction transistor B3 and the fourth parasitic bipolar junction transistor B4 is accordingly triggered to ON. The second parasitic semiconductor-controlled rectifier SCR-2 with low holding voltage ($V_{Hold}$) and low resistance ($R_{on}$) may provide a current path from the power supply terminal VCC of the circuit under protection CT to the common bus BUS to discharge the electrostatic charges away from the circuit under protection CT.

In some embodiments, the equivalent circuit of the ESD protection unit ESD-2 of the ESD protection device 500 may be formed by a parasitic diode and/or a parasitic semiconductor-controlled rectifier to provide a discharge current path to discharge the electrostatic charges away from the circuit under protection CT when the ESD event occurs between the input/output terminal IO and the power supply terminal VCC of the circuit under protection CT, between the input/output terminal IO and the ground terminal VSS of the circuit under protection CT, between the power supply terminal VCC and the input/output terminal IO of the circuit under protection CT, or between the ground terminal VSS and the input/output terminal IO of the circuit under protection CT.

Figure 8:
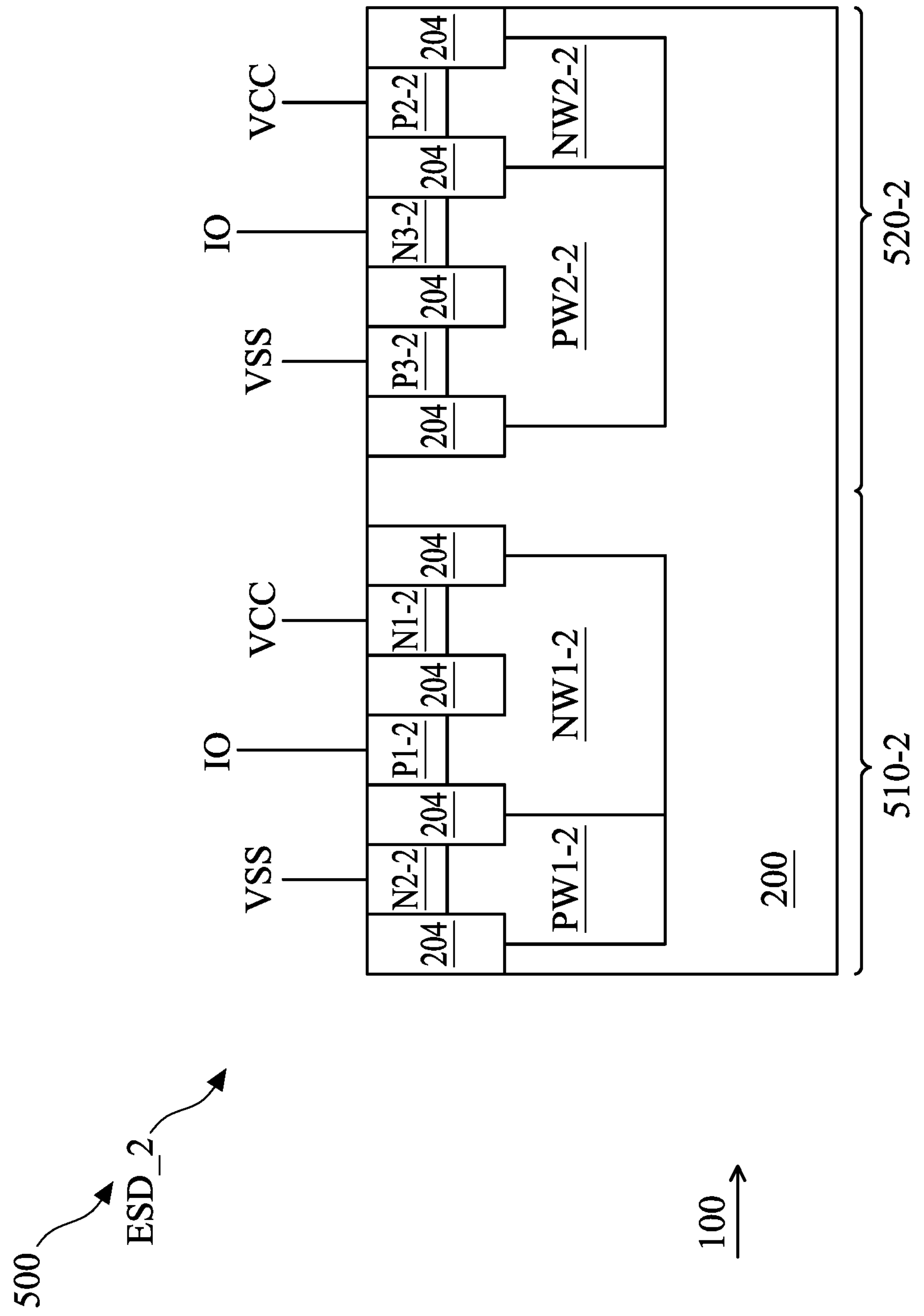
FIG. 8 is a schematic cross-sectional view of an electrostatic discharge protection unit of an electrostatic discharge protection device in accordance with some embodiments of the disclosure.

FIG. 8 is a schematic connection diagram of the ESD protection unit ESD-2 of the electrostatic discharge protection device 500 in accordance with some embodiments of the disclosure. As shown in FIGS. 1 and 8, the ESD protection device 500 further includes an ESD protection unit ESD-2 located in the P-type semiconductor substrate 200 to protect the corresponding circuit under protection CT (including the circuits under protection CT_1, CT_2 . . . CT_N). In some embodiments, the ESD protection unit ESD-1 and the ESD protection unit ESD-2 of the ESD protection device 500 are spaced apart from each other by the isolation feature 204. Moreover, the ESD protection unit ESD-1 shown in FIG. 2 and the ESD protection unit ESD-2 shown in FIG. 8 may have the same structure and equivalent circuit (including the first parasitic diode D1, the second parasitic diode D2, the first parasitic semiconductor-controlled rectifier SCR-1, and the second parasitic semiconductor-controlled rectifier SCR-2). As shown in FIGS. 2 and 8, for example, the regions 510-2 and 520-2 of the ESD protection unit ESD-2 respectively correspond to regions 510-1 and 520-1 of the electrostatic discharge protection unit ESD-1. Moreover, the first N-type well region NW1-2, the second N-type well region NW2-2, the first P-type well region PW1-2 and the second P-type well region PW2-2, the first N-type doped region N1-2, the first P-type doped region P1-2, the second N-type doped region N2-2, the second P-type doped region P2-2, the third N-type doped region N3-2 and the third P-type doped region P3-2 of the ESD protection unit ESD-2 respectively correspond to the first N-type well region NW1-1, the second N-type well region NW2-1, the first P-type well region PW1-1, the second P-type well region PW2-1, the first N-type doped region N1-1, the first P-type doped region P1-1, the second N-type doped region N2-1, the second P-type doped region P2-1, the third N-type doped region N3-1, and the third P-type doped region P3-1 of the ESD protection unit ESD-1. In some embodiments, the ESD protection unit ESD-2 is electrically connected between the input/output terminal IO of the protection circuit CT (FIG. 1) and the circuit under protection CT. In detail, the first P-type doped region P1-2 and the third N-type doped region N3-2 of the ESD protection unit ESD-2 may be electrically connected to the input/output terminal IO of the circuit under protection CT. The first N-type doped region N1-2 and the second P-type doped region P2-2 of the ESD protection unit ESD-2 may be electrically connected to the power supply terminal VCC of the circuit under protection CT. Furthermore, the second N-type doped region N2-2 and the third P-type doped region P3-2 of the ESD protection unit ESD-2 are electrically connected to the ground terminal VSS of the circuit under protection CT.

Figure 9:
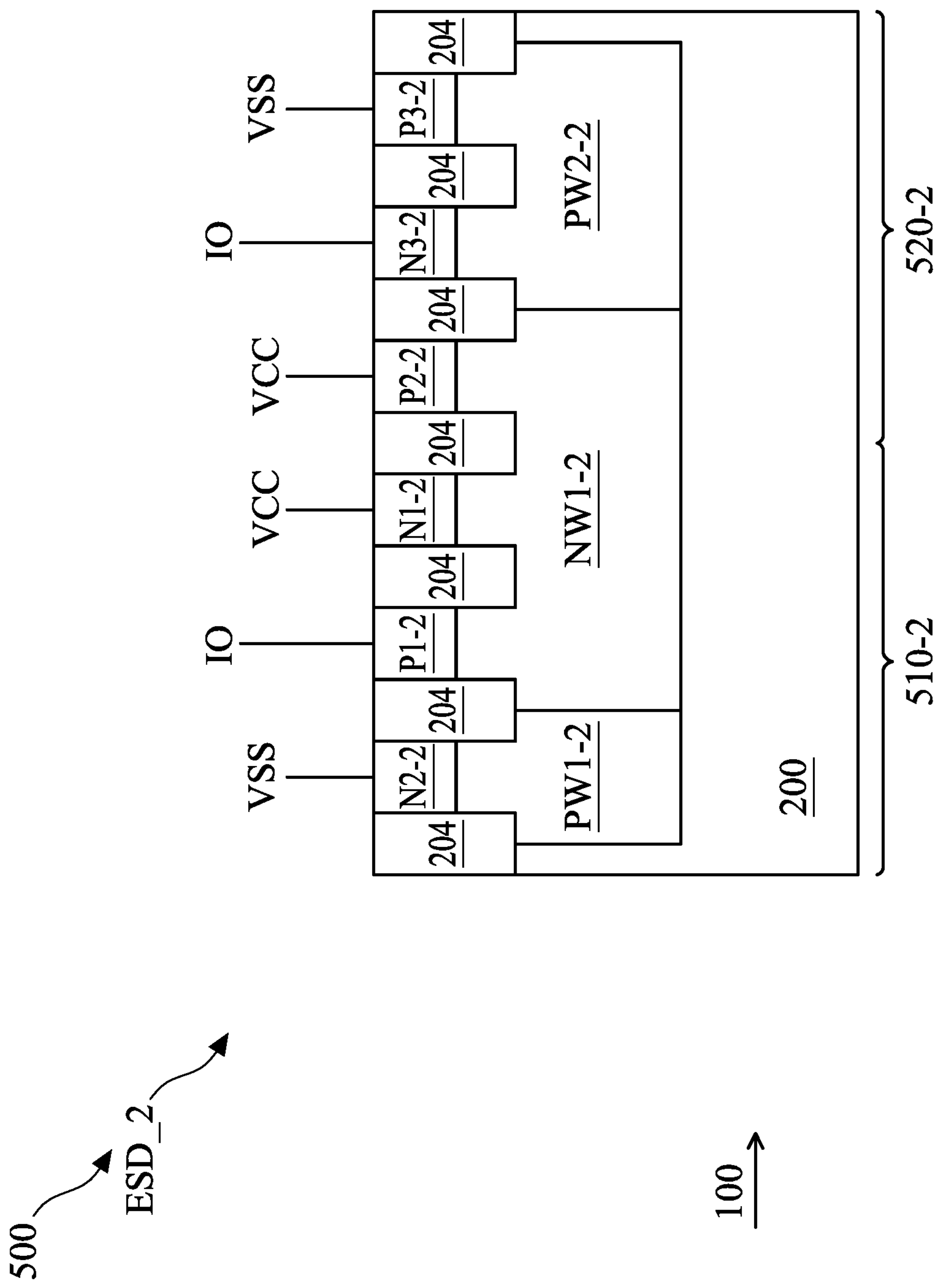
FIG. 9 is a schematic cross-sectional view of an electrostatic discharge protection unit of an electrostatic discharge protection device in accordance with some embodiments of the disclosure.

FIG. 9 is a schematic cross-sectional view of the ESD protection unit ESD-2 of the ESD protection device 500 in accordance with some embodiments of the disclosure. The ESD protection unit ESD-1 shown in FIG. 3 and the ESD e protection unit ESD-2 shown in FIG. 9 are spaced apart from each other and have the same structure and equivalent circuit. Compared with FIG. 8, the ESD protection unit ESD-2 shown in FIG. 9 may save the area of the N-type well region.

Figure 10:
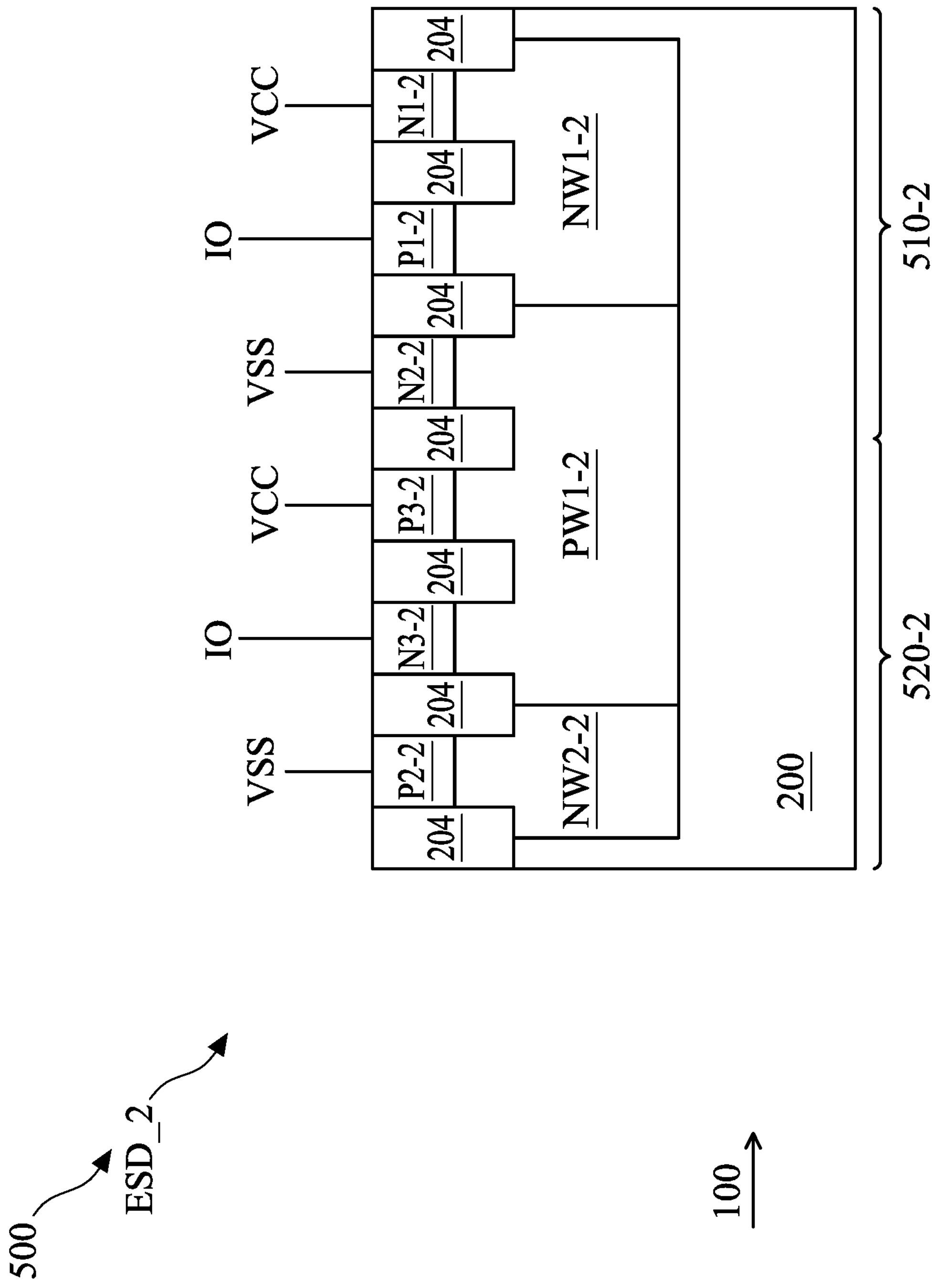
FIG. 10 is a schematic cross-sectional view of an electrostatic discharge protection unit of an electrostatic discharge protection device in accordance with some embodiments of the disclosure.

FIG. 10 is a schematic cross-sectional view of the ESD protection unit ESD-2 of the ESD protection device 500 in accordance with some embodiments of the disclosure. The ESD protection unit ESD-1 shown in FIG. 4 and the ESD protection unit ESD-2 shown in FIG. 10 are spaced apart from each other and have the same structure and equivalent circuit. Compared with FIG. 8, the ESD protection unit ESD-2 shown in FIG. 10 can save the area of the P-type well region.

In some embodiments, the electrostatic discharge protection device 500 may be also formed by any one of the ESD protection units ESD-1 in FIGS. 2 to 4 and any one of the ESD protection units ESD-2 in FIGS. 8 to 10 and not limited to the disclosed embodiments.

Figure 11:
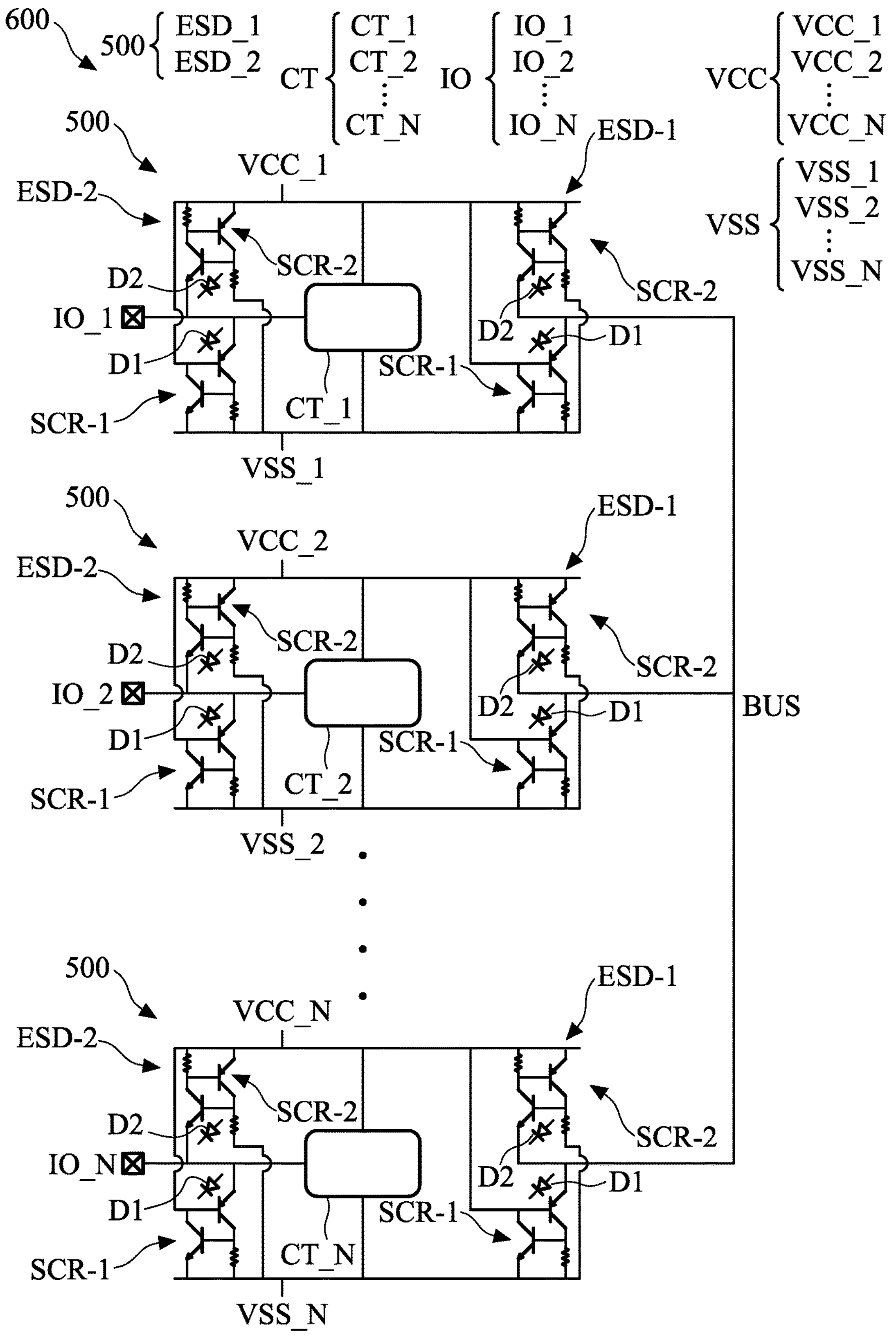
FIG. 11 is a schematic connection diagram of an electrostatic discharge protection device in accordance with some embodiments of the disclosure.

FIG. 11 is a schematic diagram of the connections between the ESD protection unit ESD-1 and the ESD protection unit ESD-2 and the circuit under protection CT of the ESD protection device 500 in accordance with some embodiments of the disclosure. When the ESD protection unit ESD-1 and the ESD protection unit ESD-2 of the ESD protection device 500 both have the same structure (and the same equivalent circuit) and are triggered to ON, the ESD protection unit ESD-1 and the ESD protection unit ESD-2 of the ESD protection device 500 may form a Wheatstone bridge structure, in which the equivalent circuits (including the first parasitic diode D1, the second parasitic diode D2, the first parasitic semiconductor-controlled rectifier SCR-1, and the second parasitic semiconductor-controlled rectifier SCR-2) of the regions 510-1 and 520-1 of the ESD protection unit ESD-1 (FIGS. 2 to 4) and the regions 510-2 and 520-2 of the ESD protection unit ESD-2 (FIGS. 8 to 10) are located on the four arms of the Wheatstone bridge structure. At this time, there is no voltage difference between the power supply terminal VCC and the ground terminal VSS of the circuit under protection CT. When an ESD event occurs between the input/output terminal IO (for example, the input/output terminal IO_1) of the circuit under protection CT (for example, the circuit under protection CT_1) of one of the electrostatic discharge protection devices 500 and the power supply terminal VCC (for example, the power supply terminal VCC_1 or VCC_2), the ground terminal VSS (for example, the ground terminal VSS_1 or VSS_2) of another of the ESD protection devices 500 or the common bus BUS, both the ESD protection unit ESD-1 and the ESD protection units ESD-2 of the ESD protection device 500 are triggered to ON, the Wheatstone bridge structure formed by the ESD protection unit ESD-1 and the ESD protection units ESD-2 of the ESD protection device 500 may prevent electrostatic charges from flowing through the power supply terminal VCC_1 and the ground terminal VSS_2 of the circuit under protection CT_1.

Embodiments of the present disclosure provide an electrostatic discharge protection device which is used to protect the circuits under protection CT (such as the circuits under protection CT_1, CT_2 . . . CT_N) in the system. The circuits under protection CT each have the input/output terminal IO, the power supply terminal VCC and the ground terminal VSS. In addition, the power supply terminal VCC and the ground terminal VSS of each of the circuits under protection CT are connected to the common bus BUS. The first ESD protection unit (e.g., the ESD protection unit ESD-1) of the ESD protection device is electrically connected between the common bus BUS and the circuit under protection CT. In addition, the first ESD protection unit includes an first N-type well region and a first P-type well region adjacent to each other, an second N-type well region and a second P-type well region adjacent to each other, a pair of N-type and P-type heavily doped regions located in the first N-type well region, a pair of N-type and P-type heavily doped regions located in the first P-type well region. The N-type heavily doped region in the first P-type well region, the P-type heavily doped region located in the second N-type well region, and a pair of N-type and P-type heavily doped regions located in the second P-type well region. Therefore, parasitic semiconductor-controlled rectifiers (SCRs) may be inserted between the common bus BUS and the power supply terminal VCC, the ground terminal VSS of the corresponding circuit under protection CT. The parasitic semiconductor-controlled rectifier is a multi-directional semiconductor-controlled rectifier, which can discharge electrostatic charges away from the circuit under protection when the electrostatic discharge event occurs between the common bus BUS and the power supply terminal VCC, or between the common bus BUS and the ground terminal VSS. Since the power supply terminal VCC and the ground terminal VSS of each of the circuits under protection CT are connected to the common bus BUS, when an electrostatic discharge event occurs at the power supply terminal VCC and the ground terminal VSS of any circuit under protection (e.g., the circuit under protection CT_1), the corresponding first ESD protection unit may discharge electrostatic charges away from the circuit under protection. In addition, the electrostatic charges may flow to the power supply terminal VCC and the ground terminal VSS of other circuits under protection (e.g., the circuit under protection CT_2 . . . CT_N) more smoothly and to be released by the first ESD protection units of other circuits under protection. Furthermore, there are commonly used trigger equivalent circuits and current discharge paths between the common bus BUS, the power supply terminal VCC and the ground terminal VSS of each of the circuits under protection CT. Therefore, the layout area of the ESD protection device can be significantly reduced. The second ESD protection unit (e.g., the ESD protection unit ESD-2) of the ESD protection device is electrically connected between the input/output terminal IO of the circuit under protection CT and the circuit under protection CT. When the first ESD protection unit and the second ESD protection unit have the same structure, Wheatstone bridge structure mat be formed when both the first ESD protection unit and the second ESD protection unit of the ESD protection device are triggered to ON. At this time, there is no voltage difference between the power supply terminal VCC and the ground terminal VSS of the circuit under protection CT. Therefore, the Wheatstone bridge structure formed by the first ESD protection unit and the second ESD protection units of the ESD protection device may prevent electrostatic charges from flowing through the circuit under protection CT.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device, comprising:

a P-type semiconductor substrate; and a first electrostatic discharge protection unit located in the P-type semiconductor substrate and used to protect a first circuit, wherein the first electrostatic discharge protection unit comprises:

a first N-type well region;

a first N-type doped region located in the first N-type well region;

a first P-type doped region located in the first N-type well region, wherein the first P-type doped region and the first N-type doped region are arranged side-by-side and spaced apart from each other;

a first P-type well region adjacent to the first N-type well region;

a second N-type doped region located in the first P-type well region;

a second N-type well region arranged side-by-side with the first N-type well region;

a second P-type doped region located in the second N-type well region;

a second P-type well region adjacent to the second N-type well region;

a third N-type doped region located in the second P-type well region; and a third P-type doped region located in the second P-type well region, wherein the third P-type doped region and the third N-type doped region are arranged side-by-side and spaced apart from each other, wherein the first P-type doped region and the third N-type doped region of the first electrostatic discharge protection unit are electrically connected to a common bus, wherein the first N-type doped region and the second P-type doped region of the first electrostatic discharge protection unit are electrically connected to a power supply terminal of the first circuit, wherein the second N-type doped region and the third P-type doped region of the first electrostatic discharge protection unit are electrically connected to a ground terminal of the first circuit, and wherein the second N-type well region of the first electrostatic discharge protection unit is a portion of the first N-type well region, so that the first N-type doped region is laterally located between the first P-type doped region and the second P-type doped region, or wherein the second P-type well region of the first electrostatic discharge protection unit is a portion of the first P-type well region, so that the third P-type doped region is laterally located between the second N-type doped region and the third N-type doped region.

2. The electrostatic discharge protection device as claimed in claim 1, wherein the first P-type doped region is laterally located between the first N-type doped region and the second N-type doped region.

3. The electrostatic discharge protection device as claimed in claim 1, wherein the third N-type doped region is laterally located between the second P-type doped region and the third P-type doped region.

4. The electrostatic discharge protection device as claimed in claim 1, wherein the first P-type doped region, the first N-type well region and the first N-type doped region form a first parasitic diode, and wherein the third P-type doped region, the second P-type well region and the third N-type doped region form a second parasitic diode.

5. The electrostatic discharge protection device as claimed in claim 4, wherein an electrostatic discharge event occurs between the common bus and the power supply terminal of the first circuit, the first parasitic diode is triggered to ON.

6. The electrostatic discharge protection device as claimed in claim 4, wherein an electrostatic discharge event occurs between the ground terminal of the first circuit and the common bus, the second parasitic diode is triggered to ON.

7. The electrostatic discharge protection device as claimed in claim 4, wherein:

the first P-type doped region, the first N-type well region and the first P-type well region form a first parasitic bipolar junction transistor, the second N-type doped region, the first P-type well region and the first N-type well region form a second parasitic bipolar junction transistor, a base of the first parasitic bipolar junction transistor is electrically connected to a collector of the second parasitic bipolar junction transistor, and a base of the second parasitic bipolar junction transistor is electrically connected to the collector of the first parasitic bipolar junction transistor to form a first parasitic semiconductor-controlled rectifier, an emitter of the first parasitic bipolar junction transistor is electrically connected to the common bus and an anode of the first parasitic diode, the base of the first parasitic bipolar junction transistor is electrically connected to the power supply terminal of the first circuit and a cathode of the first parasitic diode, and an emitter of the second parasitic bipolar junction transistor is electrically connected to the ground terminal of the first circuit.

8. The electrostatic discharge protection device as claimed in claim 7, wherein an electrostatic discharge event occurs between the common bus and the ground terminal of the first circuit, the first parasitic diode is triggered to ON, and the first parasitic bipolar junction transistor and the second parasitic bipolar junction transistor are triggered to ON, so that the first parasitic semiconductor-controlled rectifier is accordingly triggered to ON.

9. The electrostatic discharge protection device as claimed in claim 1, wherein:

the third N-type doped region, the second P-type well region and the second N-type well region form a third parasitic bipolar junction transistor, the second P-type doped region, the second N-type well region and the third P-type doped region form a fourth parasitic bipolar junction transistor, a base of the third parasitic bipolar junction transistor is electrically connected to a collector of the fourth parasitic bipolar junction transistor, a base of the fourth parasitic bipolar junction transistor is electrically connected to a collector of the third parasitic bipolar junction transistor to form a second parasitic semiconductor-controlled rectifier, an emitter of the third parasitic bipolar junction transistor is electrically connected to the common bus and a cathode of the second parasitic diode, the base of the third parasitic bipolar junction transistor is electrically connected to the ground terminal of the first circuit and an anode of the second parasitic diode, and an emitter of the fourth parasitic bipolar junction transistor is electrically connected to the power supply terminal of the first circuit.

10. The electrostatic discharge protection device as claimed in claim 9, wherein an electrostatic discharge event occurs between the power supply terminal of the first circuit and the common bus, the second parasitic diode is triggered to ON, and the third parasitic bipolar junction transistor and the fourth parasitic bipolar junction transistor are triggered to ON, so that the second parasitic semiconductor-controlled rectifier is accordingly triggered to ON.

11. The electrostatic discharge protection device as claimed in claim 1, further comprising:

a second electrostatic discharge protection unit located in the P-type semiconductor substrate and used to protect the first circuit, wherein the first electrostatic discharge protection unit and the second electrostatic discharge protection unit are spaced apart from each other and have the same structure, wherein a first P-type doped region and a third N-type doped region of the second electrostatic discharge protection unit are electrically connected to an input/output terminal of the first circuit, a first N-type doped region and a second P-type doped region of the second electrostatic discharge protection unit are electrically connected to the power supply terminal of the first circuit, and wherein a second N-type doped region and a third P-type doped region of the second electrostatic discharge protection unit are electrically connected to the ground terminal of the first circuit.

12. The electrostatic discharge protection device as claimed in claim 1, further comprising:

a third electrostatic discharge protection unit located in the P-type semiconductor substrate and used to protect a second circuit, wherein the first electrostatic discharge protection unit and the third electrostatic discharge protection unit are spaced apart from each other, and the first electrostatic discharge protection unit has a structure the same as a structure of the third electrostatic discharge protection unit, wherein a first P-type doped region and a third N-type doped region of the third electrostatic discharge protection unit are electrically connected to the common bus, a first N-type doped region and a second P-type doped region of the third electrostatic discharge protection unit are electrically connected to a power supply terminal of the second circuit, and wherein a second N-type doped region and a third P-type doped region of the third electrostatic discharge protection unit are electrically connected to a ground terminal of the second circuit.

13. The electrostatic discharge protection device as claimed in claim 12, further comprising:

a fourth electrostatic discharge protection unit located in the P-type semiconductor substrate and used to protect the second circuit, wherein the third electrostatic discharge protection unit and the fourth electrostatic discharge protection unit are spaced apart from each other, and the first electrostatic discharge protection unit has a structure the same as a structure of the third electrostatic discharge protection unit, wherein a first P-type doped region and a third N-type doped region of the fourth electrostatic discharge protection unit are electrically connected to an input/output terminal of the second circuit, a first N-type doped region and a second P-type doped region of the fourth electrostatic discharge protection unit are electrically connected to the power supply terminal of the second circuit, and wherein a second N-type doped region and a third P-type doped region the fourth electrostatic discharge protection unit are electrically connected to the ground terminal of the second circuit.

* * * * *